United States Patent
Schumann

(10) Patent No.: US 6,387,766 B1
(45) Date of Patent: May 14, 2002

(54) METHOD FOR MANUFACTURING AN INTEGRATED CIRCUIT WITH LOW THRESHOLD VOLTAGE DIFFERENCES OF THE TRANSISTORS THEREIN

(75) Inventor: Dirk Schumann, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/429,834

(22) Filed: Oct. 29, 1999

(30) Foreign Application Priority Data

Nov. 6, 1998 (DE) .......................... 198 51 313

(51) Int. Cl.[7] .............................................. H01L 21/336
(52) U.S. Cl. ........................ 438/303; 438/304; 438/519
(58) Field of Search ................................ 438/302–307, 438/514, 525

(56) References Cited

U.S. PATENT DOCUMENTS 5,516,707 A * 5/1996 Loh et al. .................... 438/302
5,552,332 A   9/1996 Tseng et al.
5,750,435 A * 5/1998 Pan .............................. 438/525
5,972,783 A * 10/1999 Arai et al. .................... 438/513
6,030,875 A * 2/2000 May et al. .................... 438/302

FOREIGN PATENT DOCUMENTS

EP          0 789 400          8/1997

OTHER PUBLICATIONS

"Nitrogen Implantation—Reverse Short Channel Effects Improvement and Its Drawbacks." Lee et al, Proc. of the SPIE, Microelectronic Device Technology, Austin, Texas, Oct. 1–2, 19997, vol. 3212, pp. 304–311.

* cited by examiner

Primary Examiner—David Nelms
Assistant Examiner—Dung A Le
(74) Attorney, Agent, or Firm—Schiff Hardin & Waite

(57) ABSTRACT

In an integrated circuit with low threshold voltage differences of the transistors and a manufacturing process for such an integrated circuit, MOS transistors of different lengths but having threshold voltages that are substantially the same are made by avoiding dopant peaks at the channel edges by an angled nitrogen implantation, so that implantation paths at those edges are occupied by nitrogen atoms.

3 Claims, 3 Drawing Sheets

METHOD FOR MANUFACTURING AN INTEGRATED CIRCUIT WITH LOW THRESHOLD VOLTAGE DIFFERENCES OF THE TRANSISTORS THEREIN

BACKGROUND OF THE INVENTION

1. Field of the Invention

The present invention is directed to an integrated circuit, particularly an integrated MOS circuit with low threshold voltage differences of the transistors therein, and to a manufacturing process for making such an integrated circuit.

2. Description of the Prior Art

In integrated MOS circuits with small transistor lengths, for example under 0.5 μm, a phenomenon known as the "reverse short channel effect" occurs. This effect is manifested as an increase of the cutoff voltage or threshold voltage given reduction of the channel length. An accumulation of dopant at the channel edges close to the source/drain regions is responsible for this effect. This accumulation of dopant is mainly caused by source/drain implantation damage at the channel edge. This cutoff voltage can increase by more than 100 mV in a transistor with a length of less than 0.5μ compared to a 10μ long transistor. This can be very disturbing, particularly for analog circuit design in which different transistor lengths occur in this range.

In current CMOS processes, an attempt is made to reduce by reducing the source/drain implantation damage by a technique known as RTP (Rapid Thermal Process). Rapid Thermal Process is a tempering range of 800° C. through 1000° C. for a time duration of 5 through 10 seconds.

The source/drain implantation damage, however, can only be incompletely achieved using this technique, which has the disadvantage that the entire thermal exposure in the CMOC process is thereby increased, and the source/drain profiles and channel profiles can be widened by the additional thermal load.

An IEEE paper at the IEDM 95, 34.4.1 through 34.4.4, pages 859 through 862 discloses nitrogen implantation into a gate oxide close to edge coverings (spacers), causing the resistance of parasitic resistors produced in the transistor due to a local reduction of the dopant concentration, to increase.

SUMMARY OF THE INVENTION

An object of the present invention is to provide an integrated MOS circuit and an appertaining manufacturing process, wherein transistors with different lengths have the same cutoff voltage insofar as possible, without an additional thermal load in the manufacturing process.

The above object is achieved in accordance with the principles of the present invention in an integrated circuit having at least two MOS field effect transistors, each having a drain region, a source region and a channel region, with the respective channel regions of the two transistors being of different unequal lengths, and wherein in each field effect transistor the source region and the drain region extend a length into the channel region, and contain regions doped with nitrogen that extend further into the channel region than the remainder of the source region and the drain region.

The above object is also achieved in a method for manufacturing an integrated circuit having at least two MOS field effect transistors, each transistor having a semiconductor body in which a source region, a drain region and channel region are generated, the respective channel regions of the two transistors being of different lengths, and wherein nitrogen is implanted into the semiconductor body at an angle differing from 90°, at the opposite edges of each of the channel areas, prior to the generation of a covering over the channel and prior to a last doping for generating the source region and the drain region.

In an embodiment of the inventive method, the dopant concentration and the angle are selected so that an area of the source region and the drain region in each transistor, generated by a first doping prior to the nitrogen implantation, is substantially enveloped by a doped area generated by the nitrogen implantation into the semiconductor body, this area doped with nitrogen proceeding further into the channel region than the doped area generated prior to the nitrogen implantation.

In a further embodiment, the angle of nitrogen implantation is less than or equal to 30°.

DESCRIPTION OF THE PREFERRED EMBODIMENTS

The invention is fundamentally based on avoiding a dopant peak in the area of the channel edges, by occupying diffusion paths with nitrogen atoms introduced by an angled nitrogen implantation prior to the generation of the spacers and the last implantation step for the generation of the source/drain regions.

Figure 1:
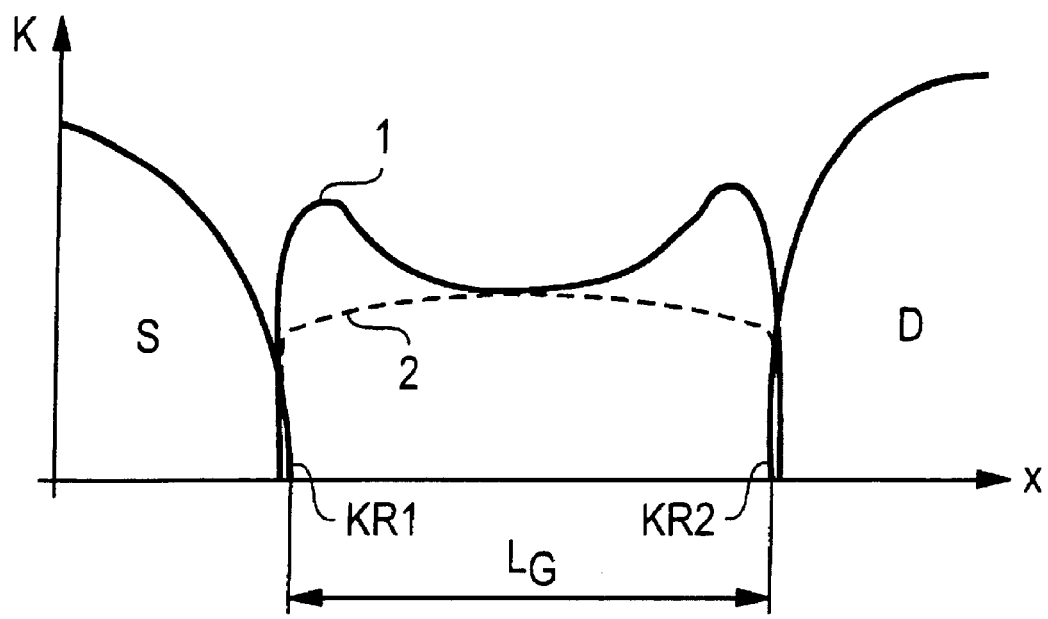
FIG. 1 shows a doping profile of an MOS field-effect transistor for explanation of the invention.

In FIG. 1, a dopant profile is shown with the concentrations K over the length x between a source region S and a drain region D. A channel area of the length $L_G$ extends between the source region S and the drain region D. A dopant profile 1 with a discernable peak close to the channel edges KR1 and KR2 is shown between a first channel edge KR1 and a second channel edge KR2. This dopant profile 1 corresponds to a dopant profile in standard MOS field-effect transistors. Additionally, a dopant profile 2, in accordance with the invention which does not exhibit a peak in the area of the channel edges and, is shown with a broken line between the channel edges KR1 and KR2. The average dopant concentration of the dopant profile 2 remains substantially the same when the channel length $L_G$ is reduced.

Figure 2:
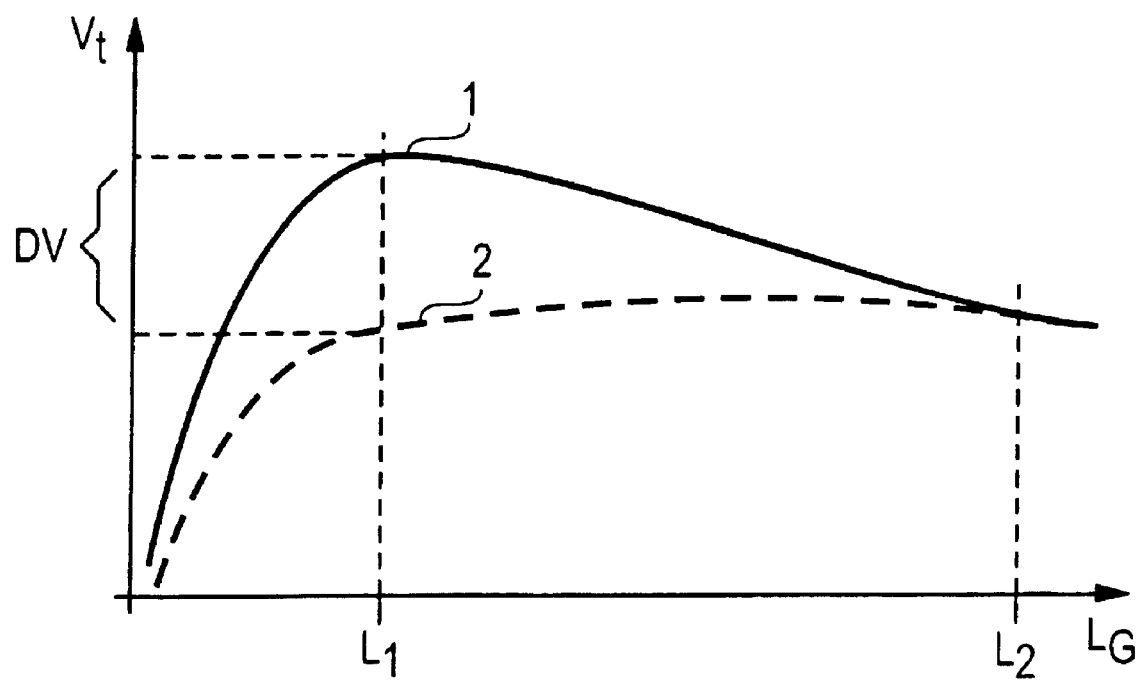
FIG. 2 is a diagram illustrating the different dependencies of the threshold voltage on the channel length.

FIG. 2 shows the threshold voltage $V_t$ in dependence on the channel length $L_G$ for the two dopant profiles 1 and 2. This clearly shows that, in the case of the invention represented by the dopant profile 2, approximately the same threshold voltage occurs for large channel lengths L2, as for small channel lengths L1. In known transistors represented by the dopant profile 1, a threshold voltage difference DV that typically lies at approximately 100 mV through 120 mV occurs given a reduction of the channel length L2 to L1.

Figure 3A:
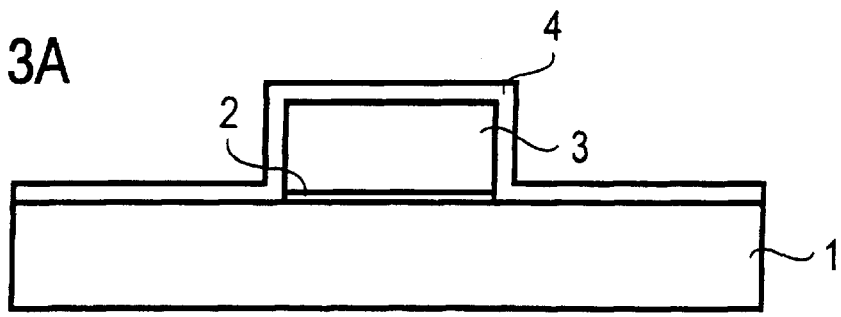
FIGS. 3A through 3D are sectional illustrations for explanation of the inventive manufacturing process.
Figure 3B:
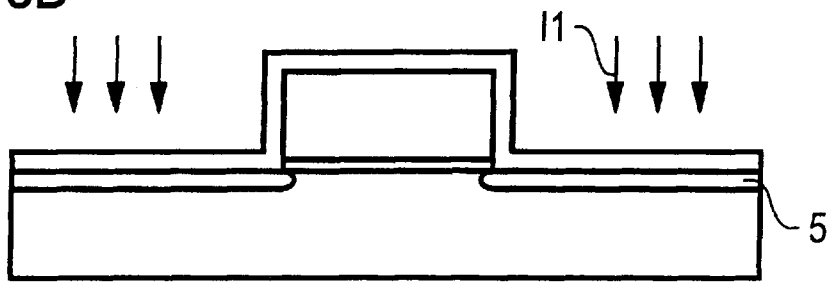
Figure 3C:
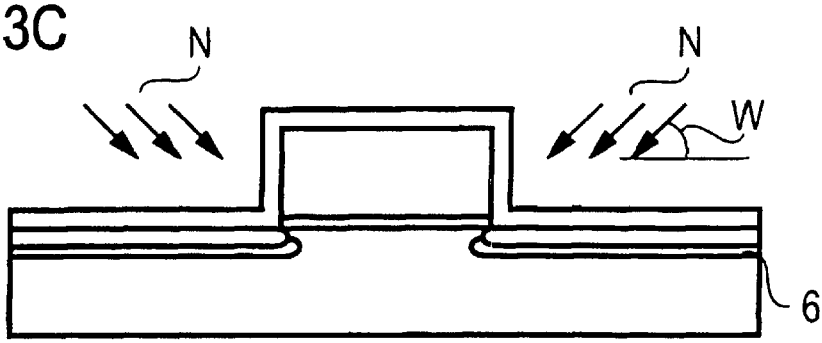

FIG. 3A shows a silicon base body 1 on which, separated by a gate oxide 2, a gate 3 is present, the silicon base body as well as the gate being enveloped by a silicon dioxide layer 4. In FIG. 3B, extension layer 5 is generated in a first step by a first implantation I1, for example with arsenic. This extension layer 5 is situated in a region of the semiconductor body 1 that is close to the surface and extends to the channel edges KR1 and KR2. FIG. 3C shows, in a second step, an angled nitrogen implantation N at an angle W. This nitrogen implantation N generates an area 6 that is referred to as a nitrogen pocket and that is situated in the semiconductor body below the extension layer. This area 6 extends somewhat farther into the channel area K than the extension layer. The angle W and the implantation dose of the nitrogen implantation are selected such that the extension layer 5 is primarily enveloped by the layer 6 within the semiconductor body.

The implantation dose typically is in a range of approximately $5 \times 10^{13}$ to $2 \times 10^{14}$ cm$^{-2}$ and the angle W typically is less than or equal to 30°.

Figure 3D:
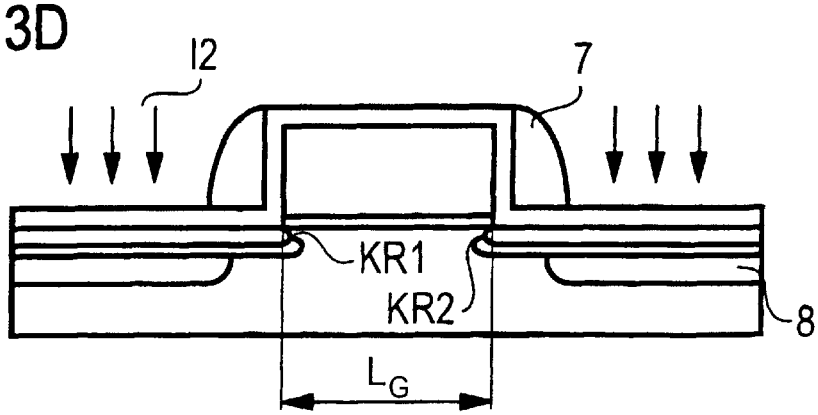

FIG. 3D shows last method steps, whereby, following the nitrogen implantation, edge coverings or etch residues 7 (spacers) are generated, HDD implantations (high density donator implantation) are generated thereafter, for example with arsenic, and subsequent curing steps ensue; thus, the remaining areas 8 of the source regions S and drain regions D are generated.

Figure 4:
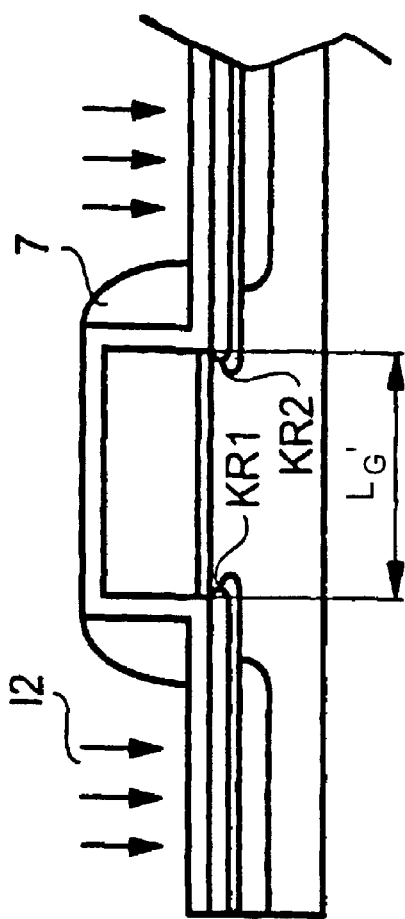
FIG. 4 is a section illustration of two transistors with respective channel lengths that are unequal, manufactured in accordance with the inventive method.

FIG. 4 is a section view showing two transistors respectively manufactured according to the steps shown in FIGS. 3A through 3D, which have unequal channel lengths $L_G'$ and $L_G''$.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for manufacturing an integrated circuit in a semiconductor body comprising the steps of:

defining a first channel length for a channel region of a first MOS field effect transistor in said semiconductor body and defining a second channel length for a channel region of a second MOS field effect transistor in said semiconductor body, said first and second channel lengths being unequal in length;

implanting nitrogen into said semiconductor body at each of said channel regions at an angle differing from 90°;

generating a channel covering at edges of each of said channel regions; and doping said semiconductor body to generate a source region and a drain region in each of said first and second MOS field effect transistors.

2. A method as claimed in claim 1 comprising the additional steps of:

defining said first and second channel lengths of said respective channel regions by conducting a first doping of said semiconductor body prior to implanting nitrogen; and selecting a dopant concentration and said angle of nitrogen implantation to produce an envelope of nitrogen in said semiconductor body surrounding regions generated by said first doping and extending further into each of said channel regions than said area generated by said first doping.

3. A method as claimed in claim 1 wherein said angle is less than or equal to 30°.

* * * * *